United States Patent [19]

Richardson

[11] Patent Number: 4,912,405
[45] Date of Patent: Mar. 27, 1990

[54] MAGNETIC LENS AND ELECTRON BEAM DEFLECTION SYSTEM

[75] Inventor: Neil Richardson, Mountain View, Calif.

[73] Assignee: Schlumberger Technology Corporation, San Jose, Calif.

[21] Appl. No.: 196,776

[22] Filed: May 17, 1988

Related U.S. Application Data

[63] Continuation of Ser. No. 863,931, May 15, 1986, abandoned, which is a continuation-in-part of Ser. No. 766,905, Aug. 16, 1985, Pat. No. 4,864,228.

[51] Int. Cl.$^4$ .................. H01J 37/141; H01J 37/147; H01J 37/256
[52] U.S. Cl. .................. 324/158 R; 250/310; 250/396 ML
[58] Field of Search ............ 324/158 R; 250/396 ML, 250/310, 311

[56] References Cited

U.S. PATENT DOCUMENTS

| | | | |
|---|---|---|---|
| 3,474,245 | 10/1969 | Kimura et al. | 250/310 |
| 4,376,249 | 3/1983 | Pfeiffer et al. | 250/396 ML |
| 4,426,577 | 1/1984 | Koike et al. | 250/310 |
| 4,437,009 | 3/1984 | Yamazaki | 250/396 ML |
| 4,514,638 | 4/1985 | Lischke et al. | 250/398 X |

FOREIGN PATENT DOCUMENTS

| | | | |
|---|---|---|---|
| 138610 | 4/1985 | European Pat. Off. | 250/396 ML |
| 198837 | 11/1983 | Japan | 250/311 |

OTHER PUBLICATIONS

J. Vac. Sci. Technol., vol. 19, No. 4, Pfeiffer et al., "Advanced Deflection Concept for Large Area, High Resolution E-Beam Lithography," Nov. 1981, pp. 1058-1063.

*Primary Examiner*—Jerry Smith
*Assistant Examiner*—Stephen M. Baker
*Attorney, Agent, or Firm*—McCubbrey, Bartels, Meyer & Ward

[57] ABSTRACT

A magnetic lens for use in an electron beam test probe system which includes an electron beam which travels along an electron beam column axis to reach the surface of a specimen which is to be examined. The magnetic lens focuses the electron beam to a selected point on the surface of the specimen. This magnetic lens also collects and collimates the secondary electrons produced in response to the electron beam bombardment of the specimen. The magnetic lens includes deflection coils for selecting the point on the specimen surface at which the electron beam is focused. The magnetic lens generates a magnetic field having a first region of intense magnetic flux substantially coincident with the selected point on the specimen surface and a second region of lesser uniform magnetic flux in which the magnetic flux lines are parallel to the electron beam column axis. This field is generated by the combination of a stationary magnetic field and a deflection magnetic field. The stationary magnetic field is modified by the deflection magnetic field which shifts the effective axis of the magnetic lens from the position of the electron beam column axis to a position which intersects the specimen at said selected point. The deflection magnetic field also results in the region of maximum magnetic flux being shifted to said point on the surface.

10 Claims, 10 Drawing Sheets

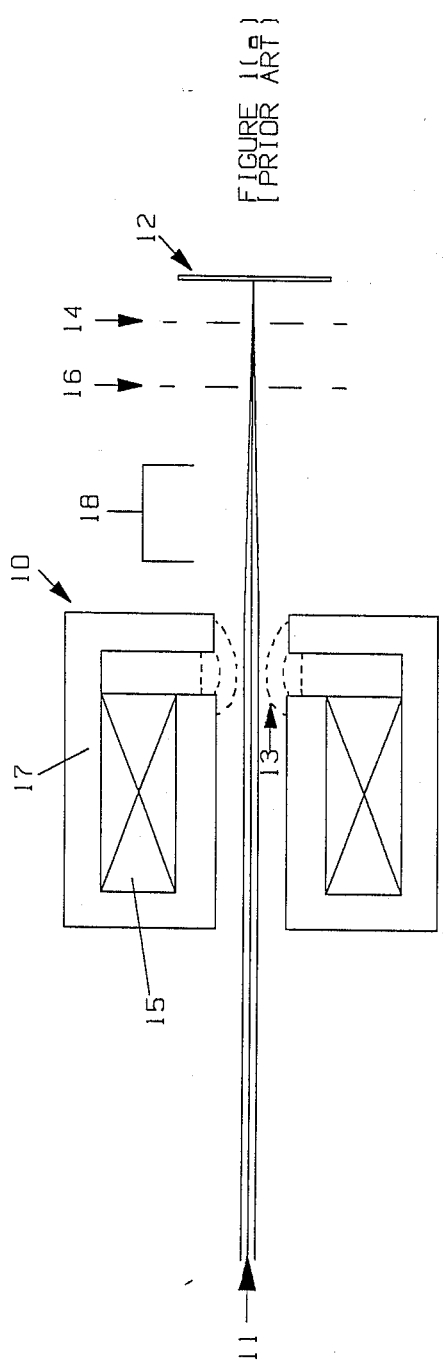
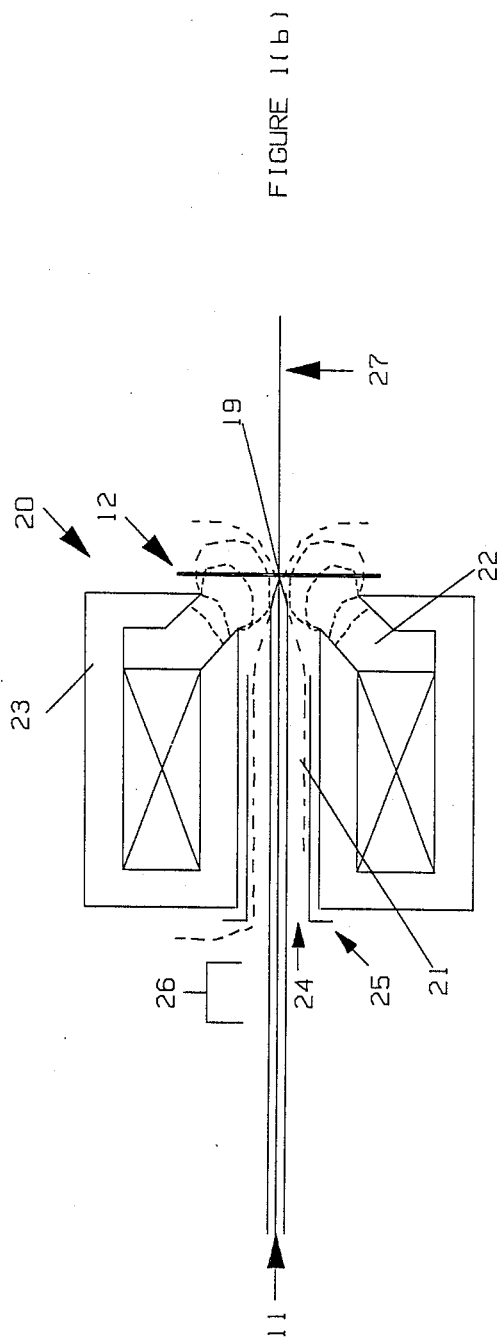
FIGURE 1(a) (PRIOR ART)
FIGURE 1(b)

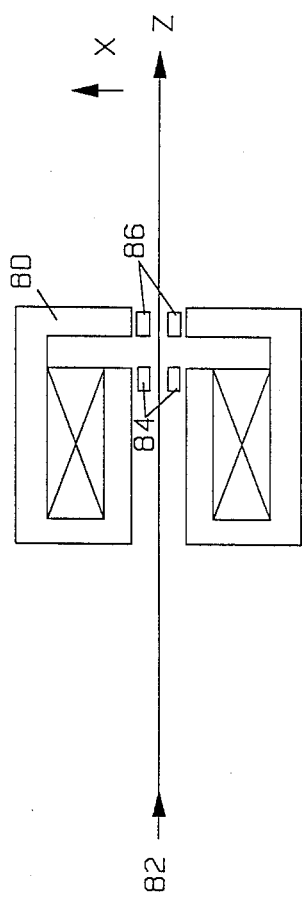
FIGURE 4(a) [PRIOR ART]
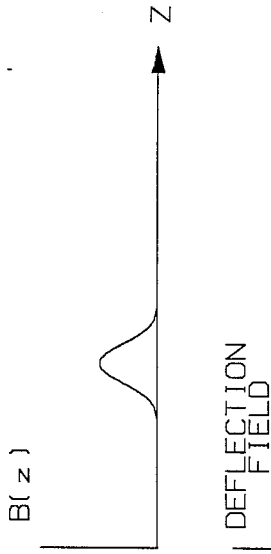
FIGURE 4(b) [PRIOR ART]
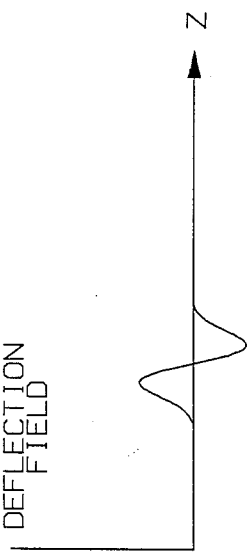
FIGURE 4(c) [PRIOR ART]

MAGNETIC LENS AND ELECTRON BEAM DEFLECTION SYSTEM

This application is a continuation of application Ser. No. 863,391, filed May 15, 1988, now abandoned, which is a continuation in-part of my copending application entitled "An Improved Electron Beam Test Probe for Integrated Circuit Testing", U.S. Ser. No. 766,905, filed Aug. 16, 1985 now U.S. Pat. No. 4,864,228.

BACKGROUND OF THE INVENTION

The present invention relates generally to the field of scanning electron microscopes used as test probes for visualizing and testing of integrated circuits and more particularly to an improved magnetic lens system for focusing the electron beam present in such test probes onto the surface of the integrated circuit and for collecting the secondary electrons produced by the interaction of the electron beam and the integrated circuit.

As a result of the progress in the design and fabrication of integrated circuits, it has become possible to create circuits having millions of conductors and transistors in which the individual conductors are of the order of one to two microns These circuits are too small and complex to be amenable to testing and analysis by techniques using mechanical probes. The mechanical probes tend to capacitively load the circuits under test, thus altering the behavior one wishes to measure. Further, the mechanical probes may actually physically damage the minute conductors with which they come in contact. Finally, the number of conductors which must be examined to debug a VLSI integrated circuit is rapidly becoming too large to be amenable to manual measurement one node at a time. As a result, test probes based on electron beams have been developed. These test probes provide a means for measuring the potential on minute conductors as well as a means for forming an image of the conductors and the surrounding circuitry without any physical damage thereto.

Such an electron beam test probe is described in the above cited copending application which is hereby incorporated by reference. In general, electron beam test probe systems measure the potential at a specified point on the surface of the integrated circuit by sensing the energy distribution of the secondary electrons produced when the point in question is bombarded by electrons. The electron beam test probe system includes a means for generating an electron beam which may be directed at any point within a specified region, referred to as the field of view, on the integrated circuit surface. The interaction of this electron beam with the surface of the integrated circuit results in the emission from the surface of secondary electrons whose energy distribution is related to the potential on the surface of the integrated circuit at the point where the electron beam is currently focused. The potential on the surface may be deduced from the fraction of the energy distribution which exceeds a predetermined value. This fraction is determined by detecting the number of secondary electrons which have sufficient energy to overcome a potential barrier and reach an electron detector.

The size of the field of view of prior art electron beam test probe systems is limited by aberrations in the electron beam optical system which increase with distance from the axis of the final lens which focuses the electron beam to a spot on the integrated circuit surface. These aberrations are significantly worse than those encountered in scanning electron microscopes, since the specimen must be spaced a considerable distance from the final lens in order to accommodate secondary electron collection hardware and hardware needed to couple signals to the integrated circuit being tested. As a result, a long focal length magnetic lens must be used. The aberrations in question increase with the focal length of the magnetic lens. In addition, as explained in the above mentioned copending application, it is desireable to use a low energy electron beam to minimize circuit damage. The extent to which chromatic aberration limits the performance of the electron beam test prob system depends on the electron beam energy and spread in electron energies within the electron beam. The performance of the system depends on the ratio of the spread in energies to the beam energy. Hence, chromatic aberration affects low energy electron beam test probe systems to a greater extent that it does high energy systems. As a result of these factors, prior art electron beam test probe systems are not able to maintain high spatial resolution and still have a field of view which encompasses the entire integrated circuit being examined.

The above cited copending application describes an improved electron beam test probe system in which a collimating magnetic lens is used both to focus the electron beam to a point on the integrated circuit surface and to collect the secondary electrons produced in response to the electron beam bombardment of said integrated circuit. This magnetic lens significantly reduces the distance needed to house secondary electron collection hardware. As a result, a shorter focal length magnetic lens with improved chromatic aberration is obtained. Although the use of this magnetic lens significantly decreases chromatic aberrations, it is still not sufficiently aberration free to allow a field of view which encompasses an entire integrated circuit. In addition, the field of view of the improved system is limited by the collection efficiency of the magnetic lens The collection efficiency of the magnetic lens decreases with distance from the axis of the magnetic lens. As explained in the above mentioned copending application, it is important to maintain a high collection efficiency to prevent artifacts in the measured potentials.

Broadly, it is an object of the present invention to provide an improved collimating magnetic lens having a field of view sufficiently large to encompass an entire integrated circuit.

It is a further object of the present invention to provide a collimating magnetic lens with decreased aberrations at points far from the axis of said lens.

It is a still further object of the present invention to provide a collimating magnetic lens which has high collection efficiency at points far from the axis of said lens.

These and other objects of the present invention will become apparent from the following detailed description of the invention and the accompanying drawings.

SUMMARY OF THE INVENTION

The present invention consists of a magnetic lens for use in an electron beam test probe system which includes an electron beam which travels along an electron beam column axis to reach the surface of a specimen which is to be examined. The magnetic lens of the present invention focuses the electron beam to a selected point on the surface of the specimen. This magnetic lens also collects and collimates the secondary electrons produced in response to the electron beam bombardment of the specimen. The magnetic lens includes deflection coils for selecting the point on the specimen surface at which the electron beam is focused. The magnetic lens collects the secondary electrons produced in response to the electron beam bombardment of the specimen and collimates these secondary electrons into a beam traveling in a direction parallel to the electron beam, but in the opposite direction. The magnetic lens generates a magnetic field having a first region of intense magnetic flux substantially coincident with the selected point on the specimen surface and a second region of lesser uniform magnetic flux in which the magnetic flux lines are parallel to the electron beam column axis. This field is generated by the combination of a stationary magnetic field and a deflection magnetic field. The stationary magnetic field is generated by a pole-piece having a cylindrical passageway whose axis is parallel to the electron beam. The pole-piece consists of a sheath of magnetically permeable material defining an annular duct around the cylindrical passageway. An electrical coil is located in said duct and gives rise to a magnetic field when energized. This magnetic field consists of a magnetic circuit having magnetic flux lines which flow mainly in said sheath. The pole-piece includes an annular slot extending through the sheath forming a gap which interrupts the portion of said magnetic circuit which is confined to said sheath such that the magnetic flux which is confined to said sheath is forced to cross said gap and extend outside the physical boundary of said sheath, the maximum magnetic field outside of said sheath being substantially coincident with the intersection of the electron beam column axis and the surface of the specimen.

The stationary magnetic field is modified by the deflection magnetic field which shifts the effective axis of the magnetic lens from the position of the electron beam column axis to a position which intersects the specimen at said selected point. The deflection magnetic field also results in the region of maximum magnetic flux being shifted to said point on the surface. The deflection magnetic field is generated by magnetic deflection coils located in the cylindrical passageway of the pole-piece near the end of said passageway which is closest to the specimen. Four deflection coils are used for this purpose. The first and second coils are located opposite each other in the passageway and form a first deflection coil pair. Similarly, the third and fourth coils are located opposite each other in the passageway and form a second deflection coil pair. The first deflection coil pair deflects the electron beam in a direction perpendicular to said electron beam column axis and the second deflection coil pair deflects the electron beam in a direction perpendicular to said electron beam column axis and perpendicular to the direction of deflection provided by the first deflection coil pair. The portion of the sheath which is subjected to the variable magnetic field is composed of ferrite to reduce eddy currents.

BRIEF DESCRIPTION OF THE DRAWINGS

FIG. 1(a) is a cross-sectional view of a prior art magnetic lens and secondary electron analyzing system.

FIG. 1(b) is a cross-sectional view of an improved collimating magnetic lens and energy analyzing system.

FIG. 4(a) is a cross-sectional view of a conventional magnetic lens which includes deflection coils for moving the effective axis of the magnetic lens.

FIG. 4(b) is a graph of the magnetic field along the axis of the magnetic lens shown in FIG. 4(a) in the absence of the deflecting field.

FIG. 4(c) is a graph of the magnetic field produced by the deflection coils in the magnetic lens shown in FIG. 4(a).

DETAILED DESCRIPTION OF THE INVENTION

Figure 1C:
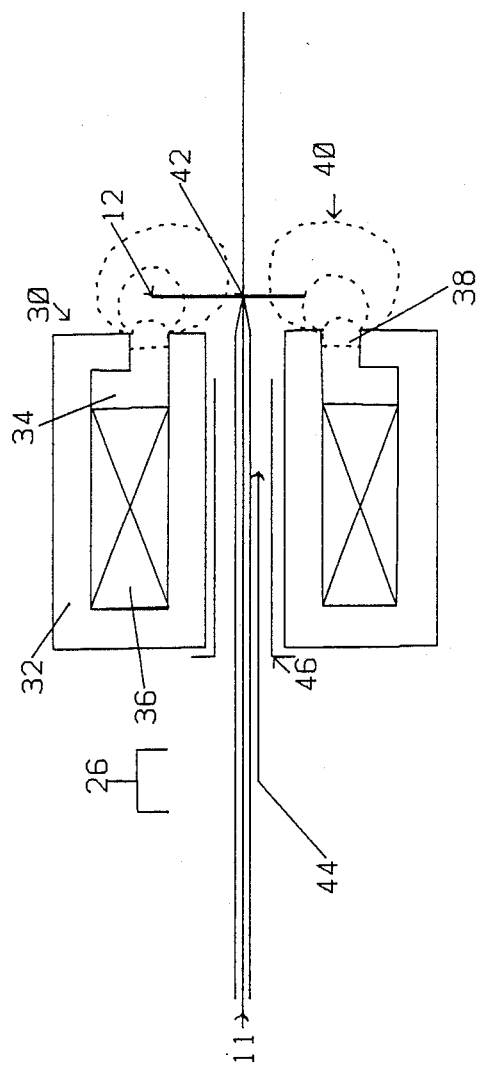
FIG. 1(c) is a cross-sectional view of a collimating magnetic lens which has a lower weight than the collimating magnetic lens shown in FIG. 1(b).

The apparatus of the present invention serves two functions. First, it focuses the electron beam to a preselected point on the specimen's surface. Second, it collects the secondary electrons produced in response to the electron beam bombardment of said point and collimates these secondary electrons into a parallel beam traveling in a direction opposite to that of said electron beam. The energy distribution of the secondary electrons in this beam may be determined by measuring the fraction of said secondary electrons which have energies greater than a predetermined energy.

The operation of the present invention may most easily be understood with reference to the magnetic lenses used in prior art electron beam test probe systems. FIG. 1(a) illustrates a typical prior art magnetic lens configuration in an electron beam test probe. The electron beam test probe includes an electron beam column which produces an electron beam 11 traveling along a direction referred to below as the electron beam column axis. The electron beam column has been omitted from the Figures for clarity. A magnetic lens is shown at 10 in FIG. 1(a) and is used to focus the electron beam 11 onto an integrated circuit 12. The magnetic lens consists of a pole-piece 17 having a cylindrical passageway in which an electrical coil 15 is wound. The pole-piece is rotationally symmetric about an axis which coincides with the center of the electron beam 11. The magnetic flux lines produced by this lens 10 when coil 15 s energized are shown at 13. The secondary electrons produced by the electron beam bombardment of the integrated circuit 12 are collected by applying a potential to an extraction grid 14. The energy distribution of the secondary electrons so collected is analyzed by measuring the number of secondary electrons which pass trough an analyzing grid 16 and which reach an electron collector 18. The analyzing grid 16 is held at a negative potential relative to the integrated circuit 12. Because of the physical space needed to accommodate the extraction grid 14, analyzing grid 16, and electron collector 18, the focal length of the magnetic lens 10 must be quite large. Since the chromatic aberration of such a lens is proportional to the focal length, such systems suffer from large chromatic aberrations, particularly when the point at which the electron beam is focused is off of the electron beam column axis.

FIG. 1(b) illustrates the improved magnetic lens configuration described in the above identified copending application. In FIG. 1(b), the electron beam 11 is focused onto the integrated circuit 12 by a collimating magnetic lens 20. It has a region 19 of maximum magnetic field which is located substantially at the surface of the integrated circuit 12 and a region o significantly lesser uniform magnetic field 21 in which the flux lines are parallel to a cylindrical passageway 24 which is formed by the pole-piece 23 of the collimating magnetic lens. This magnetic field is generated by employing a pole-piece 23 with a slanting gap 22. The pole-piece 23 is made of a magnetically permeable material. The pole-piece 23 is rotationally symmetric about the electron beam column axis 27. The region of uniform magnetic field results from the small fraction of the magnetic flux lines which are not confined in the pole-piece 23. As explained in detail in the above identified copending application, this field configuration results in the secondary electrons emitted from tee surface of the integrated circuit 12 being collimated into a parallel beam of secondary electrons traveling in a direction parallel to the axis of the cylindrical passageway 24, but in the opposite direction. This collimation eliminates the need for an extraction grid 14 as shown in FIG. 1(a). It also allows the energy analyzing grid 16 to be replaced by a cylindrical electrode 25 which is placed in the cylindrical passageway 24 of the collimating magnetic lens 20. A potential is applied to the cylindrical electrode 25. The energy distribution of the secondary electrons is measured by measuring the number of secondary electrons that have sufficient energy to overcome this potential and exit from the magnetic lens. These energetic secondary electrons are detected by a secondary electron detector 26. Hence, the spatial constraints dictated by the need to place an extraction grid, an energy analyzing grid, and an electron detector between the end of the magnetic lens and the integrated circuit 12 are removed. This allows a magnetic lens having a shorter focal length, and hence less chromatic aberration, to be used.

The minimum distance between the end of the magnetic lens 20 and the specimen 12 is determined by the various connections that must be made to the specimen 12. Typically, the specimen 12 is an integrated circuit which is being examined while a test signal pattern is applied to it. The leads needed to make the appropriate electrical connections for providing power and the test signal pattern must be connected to the integrated circuit 12 by probes which must be located between the integrated circuit and the collimating magnetic lens 20. Hence, a small space must be provided between the specimen 12 and the end of the collimating magnetic lens 20 to enable these connections to be made. The use of the slanted gap 22 shown in FIG. 1(b) enables such a space to exist while placing the point of maximum magnetic field substantially at the surface of the specimen 12.

Unfortunately, the field of view of the collimating magnetic less shown in FIG. 1(b) is too small to allow the entire integrated circuit 12 to be examined without moving the integrated circuit 12 relative to the electron beam test probe containing the collimating magnetic lens 20. The electron beam 11 is preferably moved from point to point on the surface of the integrated circuit 12 by deflecting the electron beam using an electromagnetic field which may be rapidly varied in time. Such an arrangement minimizes the time needed to move the electron beam. This is typically accomplished by deflecting the electron beam away from the electron beam column axis before it reaches the collimating magnetic lens 20. The maximum area over which the electron beam can be caused to move in this manner is referred to as the field of view of the collimating magnetic lens. The field of view obtained with prior art deflection systems is, in general, less than that required to view the entire integrated circuit 12. Hence, if the entire integrated circuit 12 is to be viewed, several fields of view must be used. The individual fields of view are chosen by positioning the collimating magnetic lens 20 relative to the integrated circuit 12 such that the desired field of view is centered on the electron beam column axis 27. In order to allow the integrated circuit 12 to remain connected to various electrical circuits supplying power and test signals, it is preferred that the electron beam test probe be moved while the integrated circuit 22 remains stationary.

To facilitate the movement of the electron beam test probe, it is desirable to minimize the weight of the electron beam test probe and hence the weight of the collimating magnetic lens 20. The distance from the end of the collimating magnetic lens 20 to the region of maximum magnetic flux in which the integrated circuit 12 is located is determined by the geometry of the gap 22 in the pole-piece 23 and the physical size of the collimating magnetic lens 20. For any given gap geometry, the distance or spacing from the bottom of the collimating magnetic lens 20 to the integrated circuit 12 may be increased by increasing the size of the collimating magnetic lens 20; however, this results in a heavier collimating magnetic lens. Hence, one wishes to choose a gap geometry which produces the largest distance between the bottom of the collimating magnetic lens 20 and the integrated circuit 12 for a given weight of iron in the pole-piece. Such a collimating magnetic lens is shown at FIG. 1(c).

Referring to FIG. 1(c), the collimating magnetic lens 30 is constructed from a rotationally symmetric pole-piece 32 containing an annular duct 34 in which an electrical coil 36 is wound. When the electrical coil 36 is energized, a magnetic circuit is generated in which most of the magnetic flux lines are contained in the pole-piece 32. The pole-piece 32 contains an annular gap 38 in the end closest to the integrated circuit 12 which interrupts the magnetic flux thereby forcing the magnetic flux to bulge out from the gap as shown at 40. This results in a region of maximum magnetic flux on the electron beam axis at 42 and a region of uniform magnetic field at 44 in which the magnetic flux lines are parallel to the electron beam axis. The magnetic flux lines in region 44 have been omitted from FIG. 1(c) for clarity. A cylindrical electrode 46 is placed in the region of uniform magnetic field. Those secondary electrons with energies great enough to overcome a potential applied to the cylindrical electrode 46 are collected by a secondary electron detector 26 when said secondary electrons exit from the collimating magnetic lens 30.

The focal length of the collimating magnetic lens 30 is determined by the strength of the magnetic field. The shape of the magnetic field lines is fixed by the lens geometry for currents in the electrical coil 36 which do not result in saturation of the magnetic field in the pole-piece 32. The current which will cause the electron beam to be focused on the integrated circuit 12 is a function of the electron beam energy, higher electron beam energies requiring higher currents. The efficiency of the collimating magnetic lens 30 in terms of the number of magnetic field lines generated per ampere-turn in the electrical coil 36 is quite low, because most of the magnetic flu is located in the region 40 far from the point 42 at which the electron beam bombards the integrated circuit 12. The active field region 42 is formed by the peripheral or "leakage" flux lines. As a result, only relatively low energy electron beams (energy <2kV) can be focused at the point of maximum magnetic field 42 on the electron beam column axis. Higher energy electron beams would require so much current in the electrical coil 36 that the pole-piece 32 would saturate and the magnetic field distribution would change to an undesirable configuration. Fortunately, as pointed out in the above mentioned copending application, the optimum energy for an electron beam test probe for analyzing an integrated circuit is of the order of 1 kV.

Figure 2:
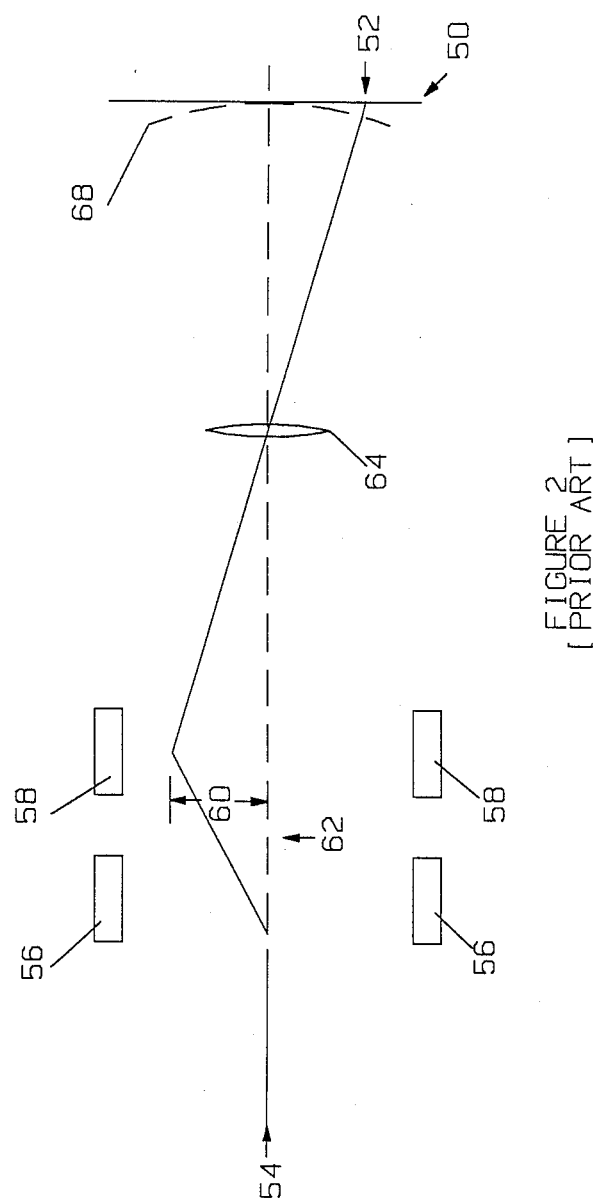
FIG. 2 illustrates a prior art deflection system for an electron beam.

Although the short focal length of collimating magnetic lens 30 greatly reduces chromatic aberration, it results in an unacceptably small field of view if a conventional deflection scheme is used. In conventional electron beam test probes, the electron beam is focused to points off the axis of the electron beam column by deflecting the electron beam using magnetic deflection coils. This is illustrated in FIG. 2. For simplicity, the magnetic lenses shown in FIG. 2 are shown as conventional optical lenses. To measure the potential on a specimen 50 at an off axis point 52, a conventional electron beam test probe first deflects the electron beam 54 using deflection coils 56 so that it enters deflection coils 58 at a distance 60 from the electron beam column axis 62. The emergent electron beam passes through the center of an objective magnetic lens 64 which focuses the electron beam onto the point 52. The magnetic lens 64 is, typically, a magnetic lens of the type shown in FIG. 1(a). In the above cited copending application, the magnetic lens 64 is a collimating magnetic lens of the type illustrated in FIG. 1(b).

The maximum off-axis deflection is limited by three factors. First, the maximum deflection is determined by the focal length of the magnetic lens 64 and the deflection distance 60. Because of the short focal length of the magnetic lens 64, a large distance 60 must be used if a large deflection is to be produced at the integrated circuit 50. Unfortunately, there is a practical limit to the deflection distance 60 which is set by the geometry of magnetic lens 58 and/or the weight of the electron beam test probe.

Second, because of its small focal length, the magnetic lens 64 has severe field curvature at the plane of the integrated circuit 50. The locus of points at which the electron beam is correctly focused is shown at 68. It coincides with the surface of the integrated circuit only near the electron beam column axis 62. Hence, the electron beam will only be focused correctly near the electron beam column axis 62.

Finally, magnetic lenses exhibit chromatic aberration much like their optical counterparts. Electrons of different energies are focused by the magnetic lens 64 at different distances from the magnetic lens 64. Since the electron beam contains a spread of electron beam energies, chromatic aberration can be a significant limitation. The greatest chromatic aberration occurs when electrons enter the magnetic lens 64 off of the axis of the magnetic lens 64 and are focused to a point on the specimen which is also off o the axis of the magnetic lens 64.

Figure 3:
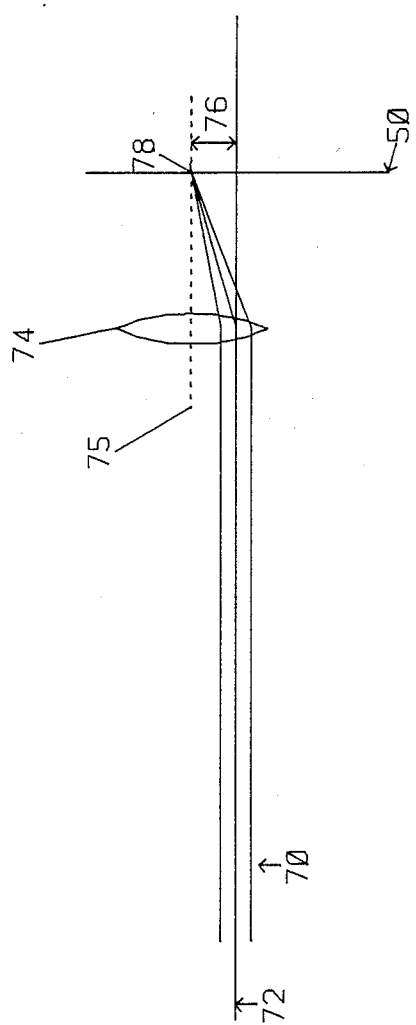
FIG. 3 illustrates an improved electron electron beam deflection system.

These limitations may be significantly reduced by using a deflection scheme in which the axis of the magnetic lens 64 is displaced relative to the electron beam column axis 62 by altering the magnetic field in the magnetic lens 64. Such a deflection scheme is illustrated in FIG. 3. Here, an electron beam 70 traveling along the electron beam column axis 72 is to be focused by a magnetic lens 74 to an off-axis point 78 on an integrated circuit 50. Instead of deflecting the electron beam 70 prior to its reaching the magnetic lens, the axis 75 of the magnetic lens 74 is shifted a distance 76 radially from axis 72 such that axis 75 of lens 74 intersects the integrated circuit 50 at the point 78 at which the electron beam 70 is to be focused. In this type of system, the electron beam 70 travels along the physical axis 72 of the electron beam column and intercepts the magnetic lens 74 at a point which is a distance 76 from the magnetic lens axis 75. The electron beam 70 is then focused to the point 78 at the intersection of the axis 75 of the magnetic lens 74 and the integrated circuit 50. The distance between the electron beam column axis 72 and the effective axis 75 of the magnetic lens 74 is controlled by changing the magnetic field in the magnetic lens 74 in the manner described below. Since the electron beam 70 is focused to a point on the axis of the magnetic lens 74, the limitations imposed by the field curvature of the short focal length magnetic lens 74 are eliminated. Further, since it is the axis of the magnetic lens 74 which is "deflected" and not the electron beam 70, the limitations imposed by the maximum deflection distance 60 shown in FIG. 2 are also eliminated. This system also has less chromatic aberration, since the aberrations of the lens and deflection field tend to cancel.

The conditions for shifting the axis of a magnetic lens have been outlined in detail in "Advanced Deflection Concept for Large Area, High Resolution E-Beam Lithography" by Pfeiffer and Langner which appears in Journal of Vacuum Science Technology, Vol. 19, pp 1058-1063, 1981. This article is hereby incorporated by reference. The simplest condition for shifting the axis of a magnetic lens is obtained from first order magnetic lens theory. Consider the conventional rotationally symmetrical magnetic lens shown at 80 in FIG. 4(a). The variation in the intensity of the magnetic field along the z-axis, B(z), in this lens is shown in FIG. 4(b). Pfeiffer and Langer have shown that the effective axis of the magnetic lens 80 may be shifted a distance, X, in the x-direction by applying a deflecting magnetic field to the electron beam 82. The effective axis of the magnetic lens will be deflected in the x-direction provided the deflection magnetic field, d(z), is given by $$d(z) = 0.5\, B'(z) X, \quad (1)$$

where z is measured along the z-axis and B'(z) is the first derivative of the magnetic field in the absence of the deflecting magnetic field, i.e., the magnetic field produced by the pole-piece of the magnetic lens. The variation of the intensity of such a deflection field is shown in FIG. 4(c). This deflection field may be approximated by placing deflection coils in the bore of the magnetic lens 80 as shown at 84 and 86. Deflection coils 86 produce a defection opposite to that of deflection coils 84. Since the distance through which the axis of the magnetic lens 80 is shifted by these deflection coils depends on the strength of the magnetic field, varying the current in these coils varies the displacement of the axis of the magnetic lens.

This theory may be applied to the magnetic lens shown in FIG. 1(c) to construct a collimating magnetic lens for use in an electron beam test probe. Such a collimating magnetic lens is shown at 90 in FIG. 5(a). In contrast to the magnetic lens 80 shown in FIG. 4(a), the intensity of the magnetic field, B(z), generated by the magnetic lens 90 has a maximum field strength in a region outside the body of the magnetic lens 90 as shown in FIG. 5(b). As explained in detail in the above identified copending application, a specimen 94 is placed at the point of maximum magnetic field in order to guarantee that the secondary electrons produced in the specimen 94 in response to bombardment of the specimen by an electron beam are collimated into a beam traveling parallel to the z-axis in a direction opposite to that of the electron beam 96. Since only the increasing portion of the magnetic field, B(z), affects the electron beam 96 before it reaches the specimen, only one set of deflection coils 98 is needed to provide the deflection field for shifting the axis of the magnetic lens 90. The magnetic field generated by the deflection coils 98 is shown in FIG. 5(c). The deflection coils 98 consist of two electrical coils for producing deflections in the x-direction. Two additional electrical coils are needed for producing deflections parallel to the y-axis. The positions of the defection coils 98 is shown in FIG. 6 which is a cross-sectional view the collimating magnetic lens 100 through a plane 103.

In order to cause the electron beam 96 to scan the specimen 94, the deflection fields must change in intensity. Such changing magnetic fields would give rise to eddy currents in the pole-piece 100 of the collimating magnetic lens 90 if the pole-piece in question is constructed from a conducting material such as iron. Such eddy currents limit the speed with which the deflection fields can be changed. To avoid this limitation, the portion 102 of the pole-piece which is subjected to the deflection magnetic field produced by the deflection coils 98 is preferably constructed from a non-conducting magnetically permeable material such as ferrite. The remainder of the pole-piece 100 is preferably constructed from iron to minimize the possibility of saturation.

The magnetic field produced by the deflection coils 98 alters the magnetic field produced by the pole-piece such that the point of maximum magnetic field on the specimen is shifted when the axis of the collimating magnetic lens 90 is shifted. The shifted magnetic field maximum is substantially at the point at which the electron beam is focused on the integrated circuit surface. As a result, the collimating magnetic lens 90 has a high collimation efficiency even at points off the electron beam column axis.

Figure 5A:
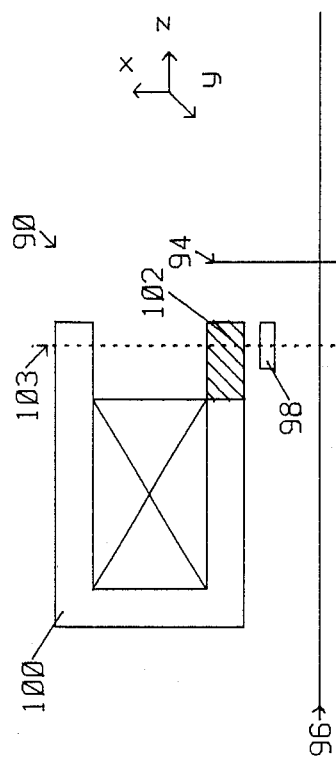
FIG. 5(a) is a cross-sectional view of a collimating magnetic lens employing deflection coils to move the effective axis of the collimating magnetic lens.
Figure 5B:
FIG. 5(b) is a graph of the magnetic field along the axis of the magnetic lens shown in FIG. 5(a) in the absence of the deflecting field.
Figure 5C:
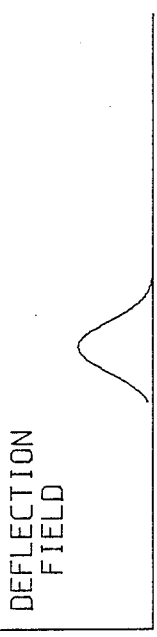
FIG. 5(c) is a graph of the magnetic field produced by the deflection coils in the magnetic lens shown in FIG. 5(a).
Figure 6:
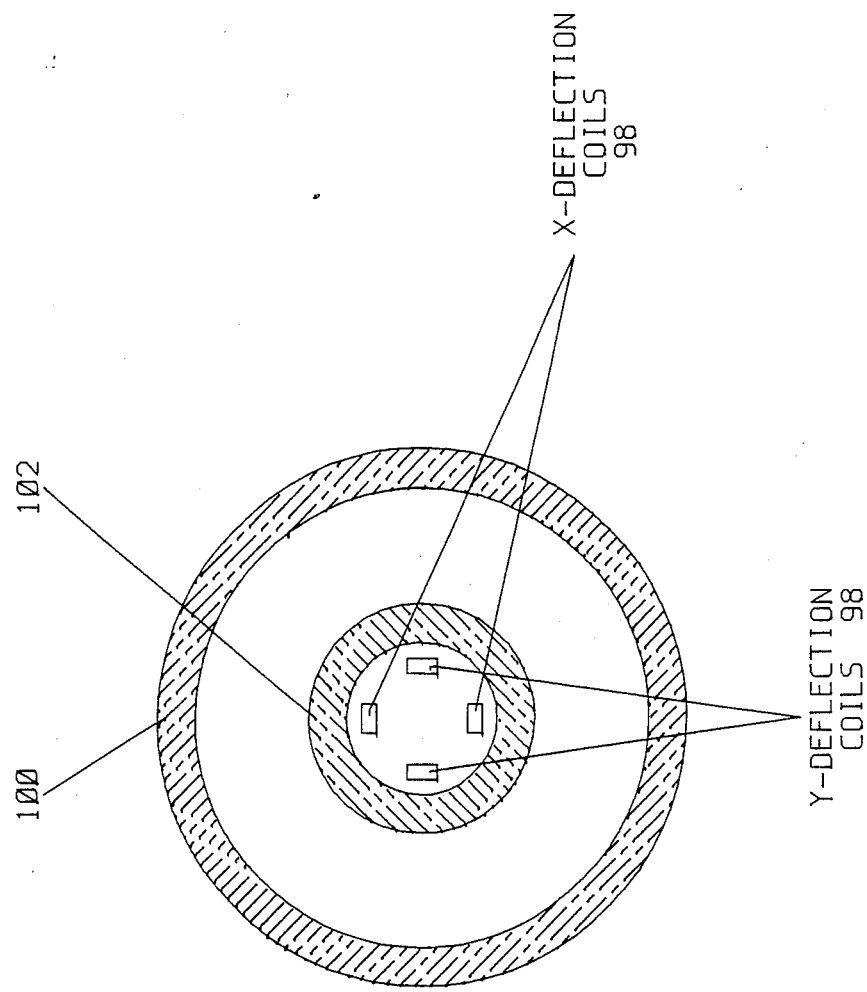
FIG. 6 is a cross-sectional view through the end of the collimating magnetic lens shown in FIG. 5(a).

The chromatic aberration of the collimating magnetic lens 90 shown in FIG. 5(a) may be reduced still further by shifting the axis of the electron beam in addition to shifting the axis of the magnetic lens. As pointed out above, chromatic aberration is most limiting when the electron beam intersects the magnetic lens off the axis of said magnetic lens and is then focused t a point which is also off the axis of said magnetic lens. The minimum chromatic aberration is obtained when two conditions are met. First, the electron beam passes through the collimating magnetic lens with the axis of the electron beam being coincident with the axis of the collimating magnetic lens. Second, the electron beam is focused to a point on the axis of the collimating magnetic lens. The collimating magnetic lens shown in FIG. 5(a) satisfies only the second of these conditions. To satisfy the first condition, the axis of the electron beam must be shifted with the axis of the magnetic lens so that the two remain coincident when the magnetic lens axis is shifted. This may be accomplished by introducing two sets of deflection coils ahead of the magnetic lens as shown in FIG. 7.

Figure 7:
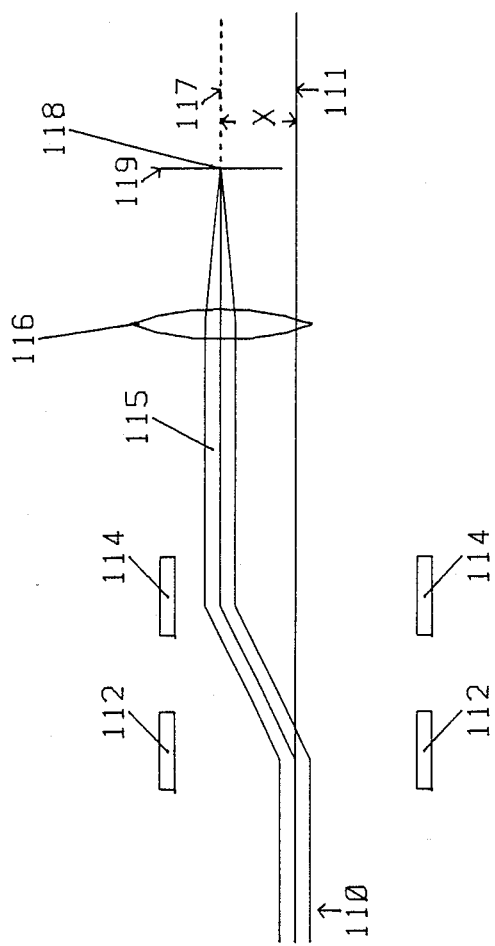
FIG. 7 illustrates a system for shifting the axis of the electron beam prior to the electron beam entering a magnetic lens.

Referring to FIG. 7, the electron beam 110 which is traveling along the electron beam column axis 111 passes through beam translation deflection coils 112 and 114 which shift the electron beam axis to position 115. Position 115 is chosen to coincide with the axis 117 of the collimating magnetic lens 116 which has been shifted by a distance X from the electron beam column axis 111. As a result of the operation o coils 112 and 114, the electron beam enters the collimating magnetic lens 116 on the axis 117 of said collimating magnetic lens and is then focused to a desired point 118 which also lies on the axis of the collimating magnetic lens 116. Point 118 also lies on the surface of a specimen 119. The above assumes that the beam translation deflection coils 112 and 114 are capable of making the required deflections without introducing chromatic aberration of their own. That is, they should not deflect electrons of different energies through different distances. In general, it is not possible to prevent the introduction of at least some chromatic aberration. However, the chromatic aberration introduced by the beam translation deflection coils in question may be substantially reduced by placing said deflection coils in the bore of the collimating magnetic lens. The beam translation deflection coils are placed in the region of uniform magnetic field. In addition, the intensity of the uniform magnetic field is increased as explained below. Such a collimating magnetic lens is shown in FIG. 8.

Figure 8:
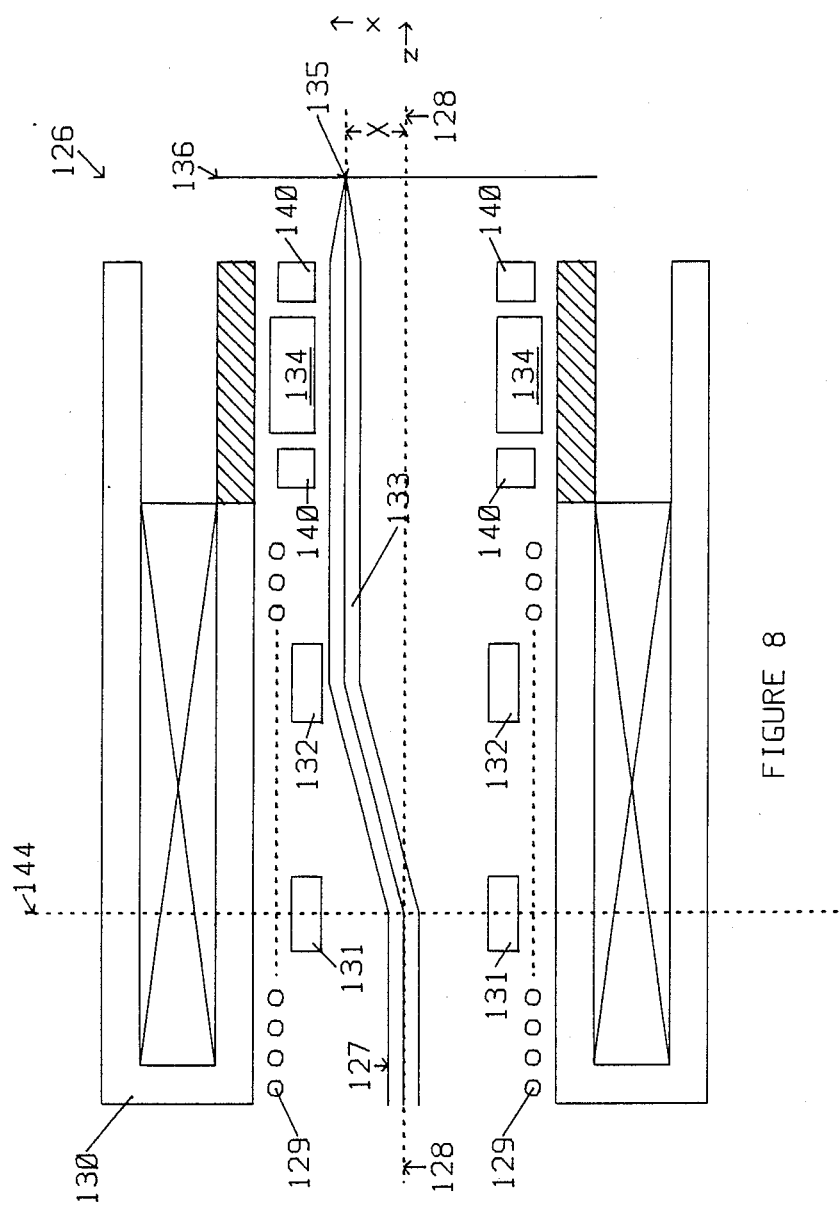
FIG. 8 is a cross-sectional view of the preferred embodiment of a collimating magnetic lens according to the present invention.

FIG. 8 is a cross-sectional view of the preferred embodiment of a collimating magnetic lens 126 according to the present invention. The pole-piece 130 is shaped as illustrated in FIG. 1(c) to minimize the weight of said pole-piece. It incorporates beam translation deflection coils 131 and 132. It also includes a solenoid 129 for adjusting the intensity of the magnetic field in the region of uniform magnetic field. The solenoid 129 consists of a cylindrical coil whose axis is parallel to the electron beam column axis 128. An electron beam 127 enters the collimating magnetic lens 126 on the electron beam column axis 128. The electron beam then passes through a first set of beam translation deflection coils 131 which deflect the electron beam 127 such that it is traveling away from the electron beam column axis 128. These coils are inside of the solenoid coil 129 used to generate the region of constant magnetic flux density inside the cylindrical passageway of the collimating magnetic lens 26. The electron beam 127 then passes between a second set of translation deflection coils 132 which deflect the electron beam 127 such that it is again traveling in the direction which is parallel with the electron beam column axis 128 as shown at 133. The deflected electron beam then passes between deflection coils 134 which are used to shift the axis of the collimating magnetic lens 126 a distance, X, from the electron beam column axis 128. Finally, the electron beam is focused to a point 135 on the specimen 136.

Figure 9:
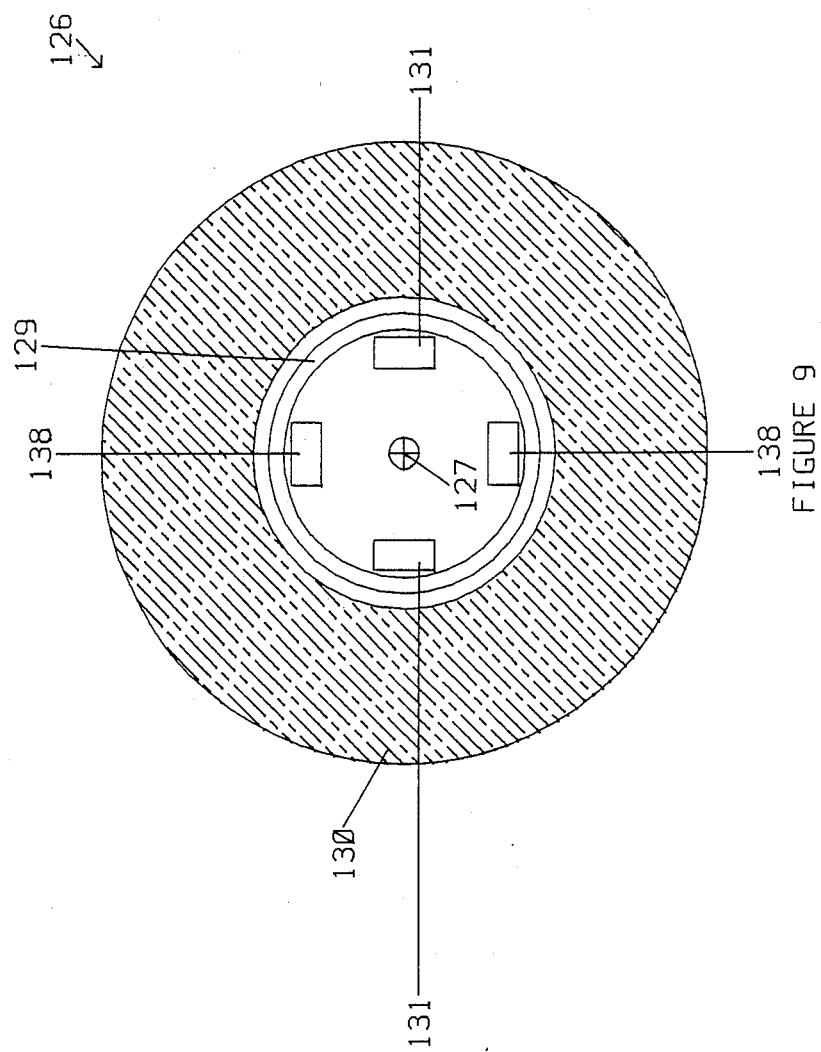
FIG. 9 is a cross-sectional view through the end of the collimating magnetic lens shown in FIG. 8.

The beam translation deflection coils 131 consist of two coils on opposite sides of the bore of the collimating magnetic lens 126. Similarly, the beam translation deflection coils 132 also consist of two coils on opposite sides of the bore of the collimating magnetic lens 126 The beam translation deflection coils 131 and 132 provide deflections in only one direction, x. Two additional sets of beam translation deflection coils are required for deflections in a direction, y, which is perpendicular to x and the electron beam column axis. These two sets of beam translation deflection coils allow the electron beam to be focused at any point having coordinates (x,y) defined in a Cartesian coordinate system on the surface of the specimen. The beam translation deflection coils 138 corresponding to beam translation deflection coils 130 are shown in FIG. 9 which is a cross-sectional view of the collimating magnetic lens 126 along the intersection of plane 144 and collimating magnetic lens 126. The beam translation deflection coils 138 are located at the same distance from the end of the collimating magnetic lens 126 as beam translation deflection coils 131 and are rotated by 90 degrees relative to said beam translation deflection coils 131. The beam translation deflection coils corresponding to beam translation deflection coils 132 are not shown, but are in locations relative to coils 13 corresponding to the locations of coils 138 with respect to coils 131.

Additional reduction in the chromatic aberration may be obtained by including two dynamic focusing coils 140 with each deflection coil 134 as shown in FIG. 8. One such coil 440 is placed on each side of each of the deflection coils 134 used in shifting the axis of the collimating magnetic lens 126. The dynamic focusing coils act in pairs to deflect the electron beam in a manner analogous to the deflection of the electron beam by the pair of deflection coils 134. Four pairs of dynamic focusing coils 140 are required, two pairs for deflections parallel to the x-axis and two pairs for deflections parallel to the y-axis.

The theory used to derive the first order correction given in Eq. (1) is derived using an approximation for the magnetic field. If a better approximation is used, a magnetic lens with lower chromatic aberration may be obtained. In the above cited reference, Pfeiffer and Langer have shown that the chromatic aberration may be further reduced by using dynamic focusing coils to modify the magnetic field generated by the deflection coils 134. The optimum combined magnetic field, b(z), generated by the dynamic focusing coils 140 and the deflection coils 134 is given by $$b(z) = 0.5\ B'(z)\ X - 0.25\ B''(z)X^2, \quad (2)$$

where $B''(z)$ is the second magnetic field when the axis of the collimating magnetic lens is not shifted, i.e., the magnetic field produced by the pole-piece of the magnetic lens, z is the distance from the end of the collimating magnetic lens, and X is the distance through which the axis of the collimating magnetic lens is to be shifted. The deflection coils 134 provide an approximation for the magnetic field represented by the first term in Equation (2). The dynamic focusing coils 140 provide a magnetic field which approximates the second term in Equation (2). This requires at least one dynamic focusing coil o each side of each deflecting coil 134 since $B''(z)$ has a different sign on each side of each deflection coil 134. The direction of the field generated by the dynamic focusing coils is the same as that generated by deflection coils 134.

As pointed out above, the collimating magnetic lens 126 provides two functions. It focuses the electron beam onto the surface of the specimen 136, and collects and collimates the secondary electrons generated at the point of bombardment. An energy analyzing electrode similar to that shown in FIG. 1(c) at 46 is placed in the region in which the secondary electrons are collimated. The energy analyzing electrode has been omitted from FIG. 8 for clarity. As discussed in detail in the above cited copending application, this collimation results when the secondary electrons are emitted in the region of maximum magnetic field and then travel into a region of lesser uniform magnetic flux. The secondary electrons are collimated in this region of uniform magnetic flux. Referring to FIG. 8, the solenoid 129 determines the strength of the uniform magnetic field. The combination of the magnetic field generated in the pole-piece 130 and the coils 13 and 140 determine the position of the point of maximum magnetic field which is substantially coincident with the point 135 at which the electron beam is focused onto the specimen 136.

The strength of the uniform magnetic field generated by the solenoid coil 129 is a compromise between the degree of collimation of the secondary electrons leaving the point of bombardment and the collection efficiency for secondary electrons over the field of view. As discussed in detail in the above cited copending application, the degree of collimation of the secondary electrons is determined by the ratio of the strength of the magnetic field at point 135 to the strength of the magnetic field in the region of uniform magnetic field. The larger this ratio, the better the collimation; hence one wishes to minimize the magnetic field in the region of uniform magnetic field, since the strength of the magnetic field at point 135 is set by the focal length of the collimating magnetic lens. However, there is a minimum field intensity needed in the uniform magnetic field region to prevent secondary electrons which are not perfectly collimated from striking the walls of the cylindrical passageway as they pass through the collimating magnetic lens. Fortunately, as discussed in detail in the above cited copending application, perfect collimation is not needed. Hence, the magnetic field in the region of uniform magnetic field is preferably set to the highest value consistent with adequate collimation. In the preferred embodiment, the ratio of the magnetic field in the two regions in question is 10:1.

Various modifications to the present invention will become apparent to those skilled in the art from the foregoing description and accompanying drawings Such modifications are intended to fall within tee scope of the appended claims.

What is claimed is:

1. In an electron beam test probe including means for generating an electron beam along an electron beam axis parallel to a first direction, z, a collimating magnetic lens for focusing said electron beam to a selected point on the surface f a specimen, said surface being substantially perpendicular to said electron beam axis, and for collimating the secondary electrons produced at said selected point in response to said electron beam bombardment of said surface, said collimating magnetic lens comprising:

stationary field means for generating a magnetic field having a first region of intense magnetic flux, said first region being substantially coincident with the intersection of said electron beam axis and said surface, and a second region of uniform magnetic flux of lesser intensity than that in said first region, the magnetic flux lines in said second region being substantially parallel to said electron beam axis; and deflecting field means for generating a deflecting magnetic field having a field strength substantially equal to $$0.5\ B'(z)\ X,$$

where $B'(z)$ is the first derivative of the field strength of magnetic field generated by said stationary field generating means and X is the distance between said selected point and said electron beam axis, the direction of said deflecting magnetic field being chosen to deflect electrons from said electron beam toward said selected point.

2. The magnetic lens of claim 1 wherein said stationary field means comprises:

a pole-piece containing a cylindrical passageway having an axis parallel to said electron beam axis; and electrical coil means coupled to said pole-piece for generating a magnetic field in said pole-piece when said electrical coil means is energized, wherein said pole-piece comprises a sheath of magnetically permeable material defining an annular duct and a cylindrical passageway having an axis parallel to said electron beam axis, said electrical coil means being located in said annular duct and producing a magnetic circuit having magnetic flux lines which flow mainly in said sheath when said electrical coil is energized and wherein said pole-piece includes a cylindrical slot defined by two concentric cylinders having axes substantially parallel to said z direction, said slot extending through said sheath forming a gap which interrupts the portion of said magnetic circuit which is confined to said sheath such that the magnetic flux that is confined to said sheath is forced to cross said gap and extend outside the physical boundary of said sheath, the maximum magnetic field outside of said sheath being substantially coincident with the intersection of said electron beam axis and said surface.

3. The magnetic lens of claim 2 wherein said selected point is defined with reference to a Cartesian coordinate system having x and y axes in a plane which is substantially coincident with the surface of said specimen and wherein said deflecting field means comprises:

x-deflection means for generating a magnetic field which causes said electron beam to be deflected in a first direction, x, parallel to the x-axis in said Cartesian coordinate system, said x-deflection means consisting of a pair of diametrically opposed deflection coils located in said cylindrical passageway near the end of said cylindrical passageway nearest to said surface, said electron beam passing between said deflection coils and means for causing an electric current to flow through said deflection coils such that the magnetic field generated by said deflection coils is substantially equal to $0.5\ B'(z)\ X,$; and y-deflection means for generating a magnetic field which causes said electron beam to be deflected in a second direction, y, parallel to the y-axis in said Cartesian coordinate system, said y-deflection means consisting of a pair of diametrically opposed deflection coils located in said cylindrical passageway near the end of said cylindrical passageway nearest to said surface, said electron beam passing between said deflection coils and means for causing an electric current to flow through said deflection coils such that the magnetic field generated by said deflection coils is substantially equal to $0.5\ B'(z)\ \dot{X},$.

4. The collimating magnetic lens of claim 3 wherein the portion of the walls of said cylindrical passageway which is subjected to the magnetic field produced by said x-deflection means and said y-deflection means is comprised of a substantially non-conducting magnetically permeable material.

5. The collimating magnetic lens of claim 4 wherein said substantially non-conducting magnetically permeable material is ferrite.

6. The collimating magnetic lens of claim 3 further comprising dynamic focusing means for generating a dynamic focusing magnetic field which in combination with said deflecting field means generates a magnetic field having a field strength substantially equal to $$0.5\ B'(z)\ X + 0.25\ B''(z)\ X^2,$$

where $B''(z)$ is the second derivative of the magnetic field strength of the magnetic field generated by said stationary field generating means, the direction of said dynamic focusing magnetic field being substantially the same as the magnetic field generated by said deflecting field means.

7. The collimating magnetic lens of claim 6 wherein said dynamic focusing means comprises first, second, third, and fourth pairs of diametrically opposed electrical coils located in said cylindrical passageway near the end of said cylindrical passageway nearest to said surface, said electron beam passing between the electrical coils comprising each said pair, wherein said first and second pairs of electrical coils are located on each side of the pair of deflection coils included in said x-deflection means, said electron beam passing between said first pair of electrical coils, then between said pair of deflection coils comprising said x-deflection means, and then between said second pair of electrical coils, and wherein said third and fourth pairs of electrical coils are located on each side of the pair of deflection coils included in said y-deflection means, said electron beam passing between said third pair of electrical coils, then between the deflection coils comprising said y-deflection means, and then between said fourth pair of electrical coils.

8. The collimating magnetic lens of claim 3 further comprising solenoid coil means for adjusting the strength of the magnetic field in said region of uniform magnetic flux comprising a cylindrically wound coil located in said cylindrical passageway and having an axis parallel to said electron beam axis.

9. The collimating magnetic lens of claim 8 further comprising translation deflection means for shifting said electron beam to a trajectory substantially parallel to said electron beam axis, said trajectory intersect the surface of said specimen at said selected point.

10. The collimating magnetic lens of claim 9 wherein said translation deflection means comprises two sets of deflection coils, one for shifting the electron beam in a direction parallel to the x-axis in said Cartesian coordinate system and one for shifting the electron beam in a direction parallel to the y-axis in said Cartesian coordinate system, each said set comprising first and second pairs of deflection coils, said electron beam passing between the coils comprising each pair of said deflection coils, said first pair of deflection coils causing the electron beam to be deflected in a direction away from said electron beam axis and said second set causing the electron beam to be deflected such that the trajectory of said electron beam is again parallel to said electron beam axis.

* * * * *

UNITED STATES PATENT AND TRADEMARK OFFICE
CERTIFICATE OF CORRECTION

PATENT NO. : 4,912,405
DATED : March 27, 1990
INVENTOR(S) : Neil Richardson

It is certified that error appears in the above-identified patent and that said Letters Patent is hereby corrected as shown below:

Column 1, line 25, after "micron" insert a period --.--.

Column 2, line 13, delete "prob" and insert therefore --probe--.

Column 2, line 39, after "lens" insert a period --.--.

Column 4, line 64, delete "s" insert therefore --is--.

Column 5, line 19, delete "o" and insert therefore --of--.

Column 5, line 32, delete "tee" and insert therefore --the--.

Column 6, line 31, delete "22" and insert therefore --12--.

Column 6, line 50, before "Fig. 1(c)" insert --30 in--.

Column 7, line 16, delete "flu" and insert therefore --flux--.

UNITED STATES PATENT AND TRADEMARK OFFICE
CERTIFICATE OF CORRECTION

PATENT NO. : 4,912,405

DATED : March 27, 1990

INVENTOR(S) : Neil Richardson

It is certified that error appears in the above-identified patent and that said Letters Patent is hereby corrected as shown below:

Column 8, line 10, delete "o" and insert therefore --of--.

Column 10, line 1, delete "t" and insert therefore --to--.

Column 10, line 24, delete "o" and insert therefore --of--.

Column 10, line 63, delete "26" and insert therefore --126--.

Column 11, line 34, delete "440" and insert therefore --140--.

Column 11, line 56, before "magnetic" insert --derivative of the--.

Column 11, line 67, delete "o" and insert therefore --on--.

Column 12, line 22, delete "13" and insert therefore --134--.

Column 12, line 63, delete "f" and insert therefore --of--.

Column 2, line 18, "that" should be --than--.

Column 4, line 3, before "beam" delete "electron".

UNITED STATES PATENT AND TRADEMARK OFFICE
CERTIFICATE OF CORRECTION

PATENT NO. : 4,912,405

DATED : March 27, 1990

INVENTOR(S) : Neil Richardson

It is certified that error appears in the above-identified patent and that said Letters Patent is hereby corrected as shown below:

Column 9, line 36, after "view" insert --of--.

Signed and Sealed this

Twenty-first Day of April, 1992

Attest:

HARRY F. MANBECK, JR.

*Attesting Officer*      *Commissioner of Patents and Trademarks*